United States Patent
Kleinhenz

[11] Patent Number: 5,770,484
[45] Date of Patent: Jun. 23, 1998

[54] METHOD OF MAKING SILICON ON INSULATOR BURIED PLATE TRENCH CAPACITOR

[75] Inventor: Richard Leo Kleinhenz, Wappingers Falls, N.Y.

[73] Assignee: International Business Machines Corporation, Armonk, N.Y.

[21] Appl. No.: 768,018

[22] Filed: Dec. 13, 1996

[51] Int. Cl.$^6$ .............................................. H01L 21/8242
[52] U.S. Cl. ........................................... 438/155; 438/249
[58] Field of Search .................................. 438/152, 155, 438/156, 243, 246, 248, 249

[56] References Cited

U.S. PATENT DOCUMENTS

| | | | |
|---|---|---|---|
| 4,104,086 | 8/1978 | Bondur | 148/1.5 |
| 4,820,652 | 4/1989 | Hayashi | 437/52 |
| 4,999,312 | 3/1991 | Yoon | 437/52 |
| 5,075,248 | 12/1991 | Yoon et al. | 438/249 |
| 5,309,008 | 5/1994 | Watanabe | 257/304 |
| 5,348,905 | 9/1994 | Kenney | 438/249 |
| 5,384,277 | 1/1995 | Hsu et al. | 437/52 |
| 5,406,515 | 4/1995 | Rajeevakumar | 365/182 |
| 5,466,625 | 11/1995 | Hsieh et al. | 437/52 |
| 5,508,219 | 4/1996 | Bronner et al. | 437/52 |

*Primary Examiner*—Chandra Chaudhari
*Attorney, Agent, or Firm*—Kris V. Strikrishnan

[57] ABSTRACT

A method of forming a DRAM storage cell with a trench capacitor in an SOI substrate is taught. The method involves forming an field effect transistor (FET) consisting of a source, drain, channel regions in a device layer, a gate oxide layer on the surface of the device layer and a gate electrode over the channel region. The trench capacitor is formed by the following steps: 1) forming a masking layer over the device layer and patterning an opening corresponding to the trench in the masking layer, 2) anisotropically etching a first trench corresponding to the opening in the masking layer to a first depth, through the SC device layer and the buried oxide layer, extending slightly into the substrate body, 3) forming a diffusion barrier collar along the sides of the first trench to the first depth, 4) forming a second trench by anisotropically etching the substrate body exposed by the first trench to a second depth, so that the silicon of substrate body exposed by the second trench becomes a first electrode of the trench capacitor, 5) forming a node dielectric layer on surface of the substrate body exposed by the first trench, 6) forming a doped polysilicon plug in the first and second trench so as to form a second electrode of the trench capacitor, said plug further making contact to the drain region of the FET. A separate substrate contact to the substrate body is formed through the front or backside so as to contact to the first electrode of the capacitor. Oxide isolation regions between adjacent transistors are formed to complete the SOI-DRAM.

23 Claims, 6 Drawing Sheets

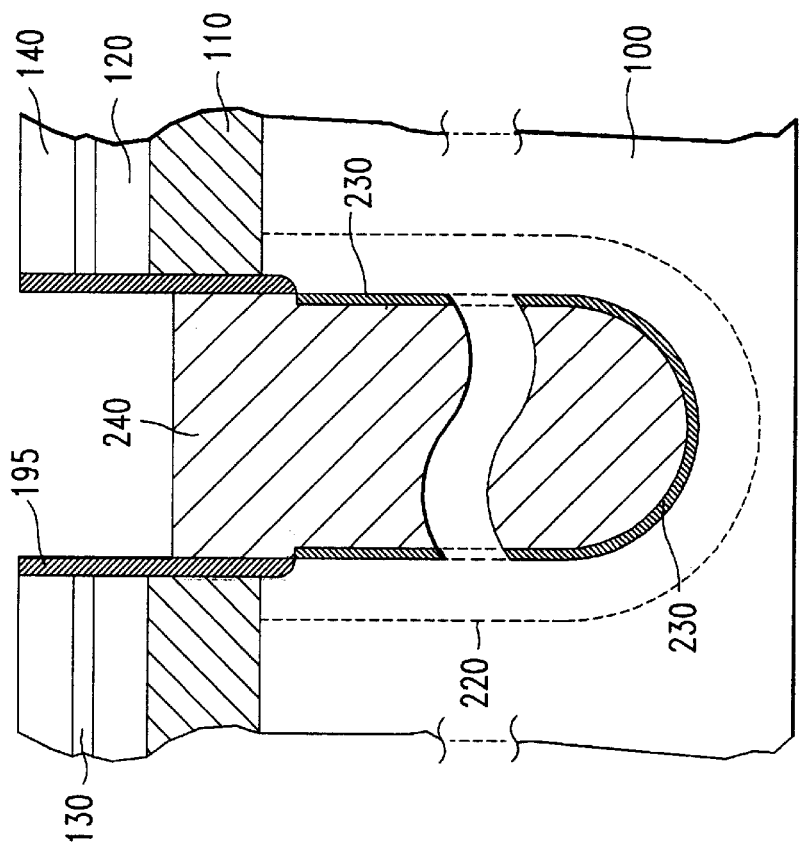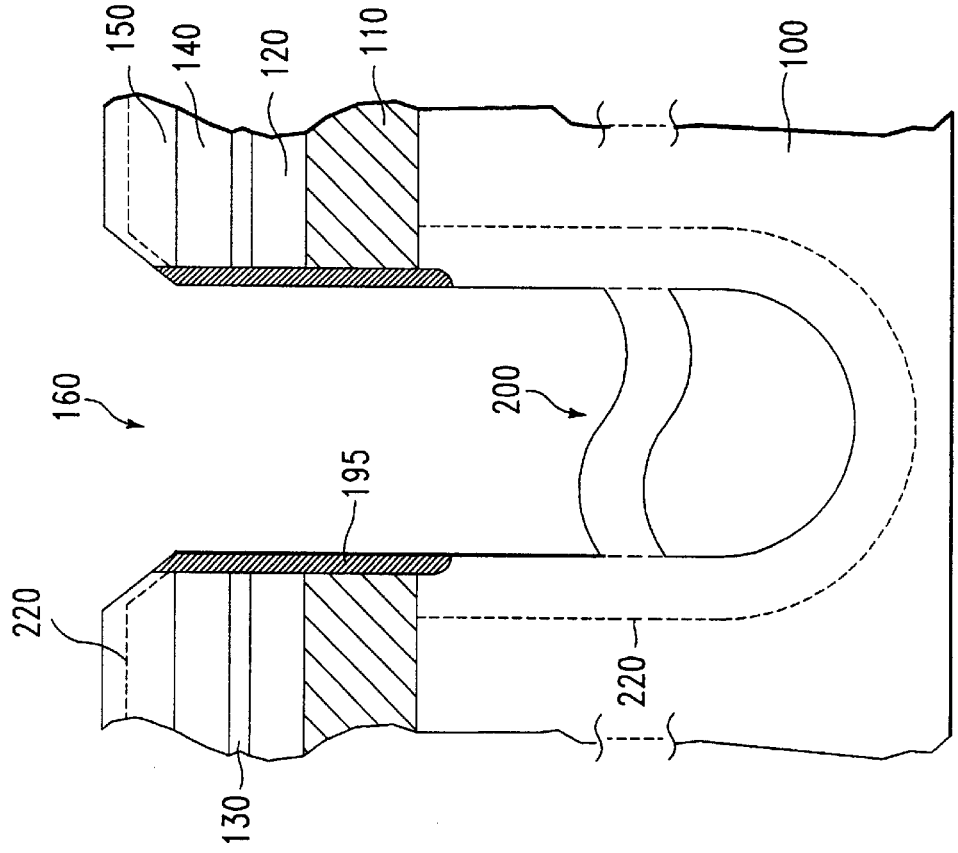

METHOD OF MAKING SILICON ON INSULATOR BURIED PLATE TRENCH CAPACITOR

FIELD OF INVENTION

The present invention relates generally to semiconductor manufacturing, and in particular to a trench capacitor built on a silicon on insulator (SOI) substrate with a buried plate for semiconductor memory application.

BACKGROUND OF THE INVENTION

The technology of SOI substrates is well known in the field of semiconductor, and use of SOI for building semiconductor devices has been recognized for providing greater immunity to radiation damage, lower substrate capacitance and permitting use of lower voltage for device operation than achievable with standard silicon substrate. The memory technology, in particular the dynamic random access memory (DRAM) has continued to evolve into more bits per chips; 64 Mbit chips are in manufacturing and 256 Mbit chips are in development in many corporations. The chip sizes are kept small by using smaller design features to offset the effect of increase in number of devices. In describing the invention, DRAMs will be used in all discussions herein, as trench capacitors are extensively used in DRAMs for data storage. This would allow a review of the state of the art in trench capacitor devices and processes used therefor and thus facilitate discussion of the novel features of the present invention. However, it is recognized that the present invention can be used in other applications. Common DRAM cells uses a single transistor connected to a capacitor. A typical layout of DRAM cell/circuit is shown in FIG. 1. A DRAM bit consists of a transistor and a capacitor, in which the capacitor stores the charge as an indicator of the memory state of the device bit.

In the present invention, the capacitor is built in a trench (as against stacked, planar capacitors) and the transistor is built on an SOI substrate for the previously mentioned reasons. Even though the concept of a trench capacitor and FET transistor and processes for making them are well known in the field, the use of SOI substrate and the small size of the memory cells (high density) require process inventions to develop a robust and easily manufacturable process.

Yoon (U.S. Pat. No. 4,999,312) describes a process for forming a trench capacitor, consisting of forming a first trench with barrier liners on the sidewall and a second trench below the first trench without any barriers, so as to allow doping of the walls of the second trench sides selectively. Yoon's device is built on a silicon substrate. Watanabe (U.S. Pat. No. 5,309,008) in a slight variation, starts with a top trench with a slightly larger diameter and subsequently form a bottom trench beneath the top trench. In Watanabe's trench, built on a silicon substrate, the sidewall of the top trench is lined with an insulating diffusion barrier and dopants are diffused into the sidewall of the bottom trench, to make doped silicon sidewall as a capacitor electrode. A thin insulator covering the walls of the bottom trench serves as the capacitor dielectric, and the trench is filled with a conducting polysilicon which acts as the second capacitor electrode. Hsu et al. (U.S. Pat. No. 5,384,277) attempts to simplify processing sequence by combining processes for capacitor-drain strap with that for source/drain contact. Rajeevakumar (U.S. Pat. No. 5,406,515) describes a trench capacitor DRAM, wherein the CMOS is built in an n-well formed in a p– epi layer over a p+ substrate. U.S. patent '515 describes the formation of a diffusion ring in the upper part of the trench wall in the n-well region which reduces the storage charge leakage. All of the above references teach building a trench capacitor DRAM on a Si substrate, differences from one another being incremental changes in process and structure to improve DRAM performance or reduce process complexity.

In SOI wafers, the silicon substrate is physically insulated from the single crystal device layer, wherein the transistors are formed. Therefore, the electrical connection of the trench capacitor electrodes to the transistor drain electrode and to a common potential exterior electrode is not obvious or straight forward. Hsieh et al (U.S. Pat. No. 5,466,625) uses a SOI substrate, but simply uses the trench as a space to support deposited layers of polysilicon electrodes sandwiching an insulator. The bottom polysilicon layer makes a sidewise contact to the epi layer, which is patterned to define source region of a vertical FET. Hsieh et al. proceeds to build a vertical FET transistor by using a poysilicon layer as a drain. Bronner et al. (U.S. Pat. No. 5,508,219) describes a SOI DRAM with a trench capacitor, where a strap polysilicon layer within the trench, connects the polysilicon capacitor electrode to the side of the device layer (drain region). The process teaches formation of a field shield polysilicon layer at selected sites between deep trench capacitors and is not concerned with the formation of the trench capacitor itself. Hayashi (U.S. Pat. No. 4,820,652) teaches an integrated process that fabricates an SOI wafer by epitaxial overgrowth and a trench capacitor. The trench was purposely offset with respect to the opening in the buried oxide which allows for the trench capacitor plate sidewall to connect to the epitaxial layer and the inner electrode is subsequently connected to the transistor using a strap. The epitaxially overgrown silicon is suitable for TFT transistors, but does not provide good single crystalline films or allow building of a single crystalline FET device.

Therefore, there is still a need for an improved trench process that is manufacturable, lead to self-aligned contacting structures and results in a capacitor that is easily integrated to a transistor formed on an SOI substrate.

SUMMARY OF THE INVENTION

A method of forming a DRAM storage cell with a trench capacitor in an SOI substrate is taught. The method involves forming a field effect transistor (FET) consisting of a source, drain, channel regions in a device layer, a gate oxide layer on the surface of the device layer and a gate electrode over the channel region. The trench capacitor is formed by the following steps: 1) forming a masking layer over the device layer and patterning an opening corresponding to the trench in the masking layer, 2) anisotropically etching a first trench corresponding to the opening in the masking layer to a first depth, through the SC device layer and the buried oxide layer, extending slightly into the substrate body, 3) forming a diffusion barrier collar along the sides of the first trench to the first depth, 4) forming a second trench by anisotropically etching the substrate body exposed by the first trench to a second depth, so that the silicon of substrate body exposed by the second trench becomes a first electrode of the trench capacitor, 5) forming a node dielectric layer on surface of the substrate body exposed by the first trench, 6) forming a doped polysilicon plug in the first and second trench so as to form a second electrode of the trench capacitor, said plug further making contact to the drain region of the FET. A separate substrate contact to the substrate body is formed through the front or backside so as to contact the first electrode of the capacitor. Oxide isolation regions between adjacent transistors are formed to complete the SOI-DRAM.

OBJECTS OF THE INVENTION

An object of the present invention is to develop a process for high density storage device in an SOI substrate.

Another object of the present invention is to develop a process for a trench storage capacitor in an SOI substrate.

A further object of the present invention is to form the substrate plate as one of the trench capacitor electrodes using a self-aligned process.

Yet another object of the present invention is to develop a process that is easily integrated in existing manufacturing.

BRIEF DESCRIPTION OF THE DRAWINGS

The objects, features and advantages of the present invention will be apparent from the following more particular description of the invention illustrated in the accompanying drawings, in which:

FIGS. 3–10 illustrate the preferred embodiment of the present inventive process for forming a trench capacitor in a SOI substrate.

DETAILED DESCRIPTION OF THE INVENTION

Figure 1:
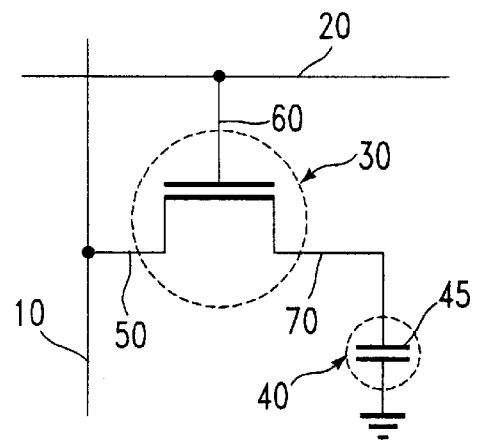
FIG. 1 illustrates a prior art DRAM cell layout.

FIG. 1 shows a prior art DRAM memory cell using a single transistor 30 and a single capacitor 40. A bit line 10 is connected to the source region 50 of the transistor 30, the word line 20 to the gate region 60 side of the transistor and one electrode 45 of the capacitor 40 to the drain 70 side of the same transistor. The operation of such a cell is well known in the field and will not be discussed herein.

Figure 2:
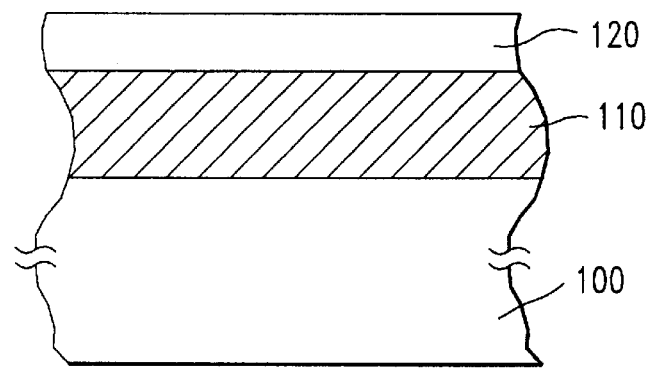
FIG. 2 illustrates a typical SOI wafer, which is used as the starting substrate.

FIG. 2 shows a typical SOI substrate, showing a silicon substrate 100 with a device silicon layer 120 and a buried insulating oxide layer 110 in between the device layer 120 and the substrate 100. The silicon substrate is typically single crystal silicon and is primarily used to support the oxide layer and device layer. The methods used to manufacture an SOI substrate, such as bonding and thinning, oxygen implant etc, are well known in the industry. These SOI substrate manufacturing techniques will not be discussed here as they are not directly pertinent to the present invention. The device layer 120 may be a high quality grown single crystal layer (in the case bonded SOI) or part of high quality single crystal substrate (in the case of implanted oxide, SIMOX), usually doped with conductivity determining impurities (dopants) in the range of $10^{16}$ to $10^{18}$/cc. However, in some of the application, this device layer 120 can have insulating regions or conducting regions with different impurities therein, prior to or after the formation of the SOI substrate. For the purpose of the present discussions, many of these variations will not be considered, as they do not directly affect the formation of the trench capacitor and the connection of the capacitor electrode to the selected diffusion region (drain) of the transistor formed in the device layer 120.

Figure 3:
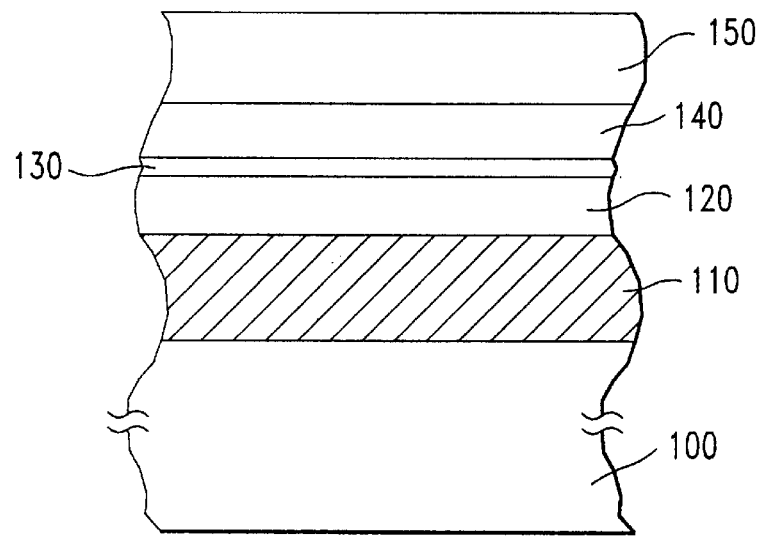

Now referring to FIG. 3, the silicon layer 120 is oxidized to form a thin silicon dioxide layer 130, about 10 nanometer thick. Layer 130 is preferably formed by thermal oxidation, but other methods such as chemical vapor deposition can also be used. A blanket layer of silicon nitride 140 is formed over layer 130. Layer 140 is preferably formed in the thickness range of 100–250 nanometer and deposited by chemical vapor deposition. The specific process conditions available for depositing good quality silicon nitride CVD films are well known in the field and will not be described here. A layer of silicon dioxide 150 is deposited over layer 140 in a thickness range of 250 to 750 nanometer. The primary purpose of these stacked layers is to provide a hard mask for etching the silicon trench which can be several microns deep.

Figure 4:
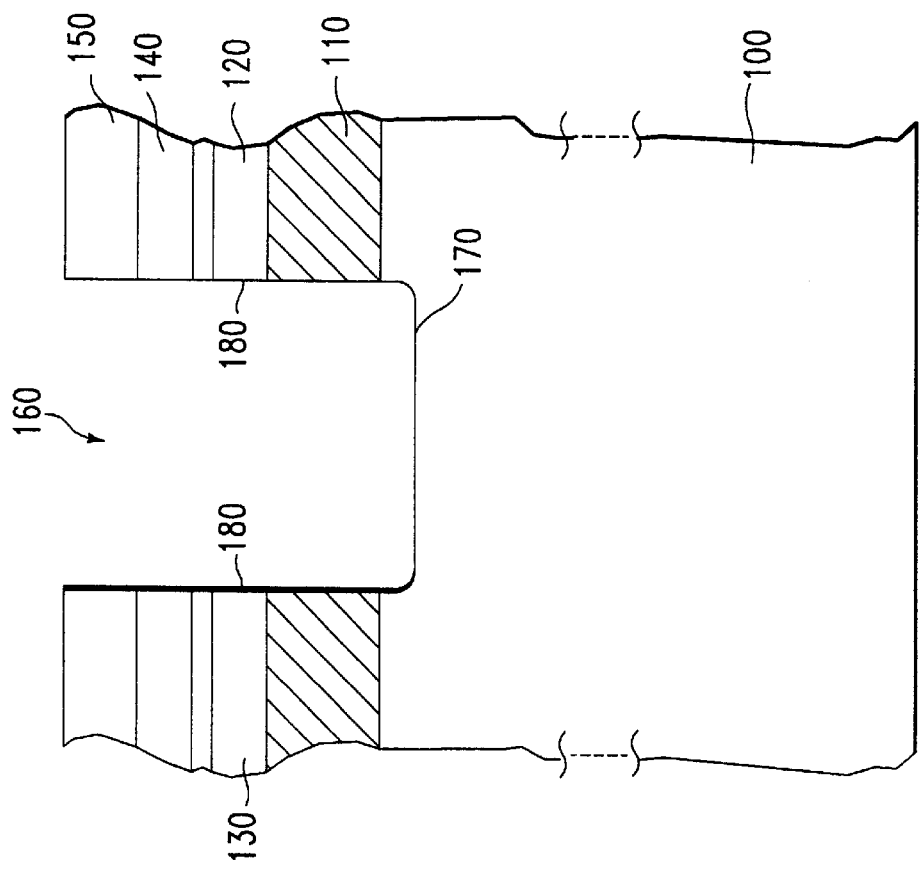

Referring to FIG. 4, a photoresist mask (not shown) typically having a resist thickness in the range of 0.5 to 2 microns is used to etch an opening through the mask layers 150, 140 and 130 and continue etching through the device silicon layer 120 and slightly pass the buried oxide layer 110 into the substrate 100. Other combinations of hard mask layers can also be used. If the trench etch process gives the required selectivity to resist, it might be even possible to use the resist layer alone as the masking layer. It is important that this first etch depth is past the buried oxide layer 110 for SOI substrate. There is no equivalent requirement in the case of regular silicon substrate, where the first etch is taken to an arbitrary shallow depth. This etching is done preferably using a single wafer multichamber system such as Applied Materials 5000 using CF4, CHF3 and O2 in a multistep process to etch through the hard mask layers. Subsequently the silicon device layer 120 is etched using chlorine containing gases and processes similar to ones described in U.S. Pat. No. 4,104,086 assigned to the assignee of the present invention. Next the oxide layer 110 is etched in the exposed trench region using etch process selective to silicon. The excess etch of the exposed silicon into the substrate past the buried oxide layer 110 is controlled by time of etch to a depth typically in the range of 50 to 200 nm.

Figure 5:
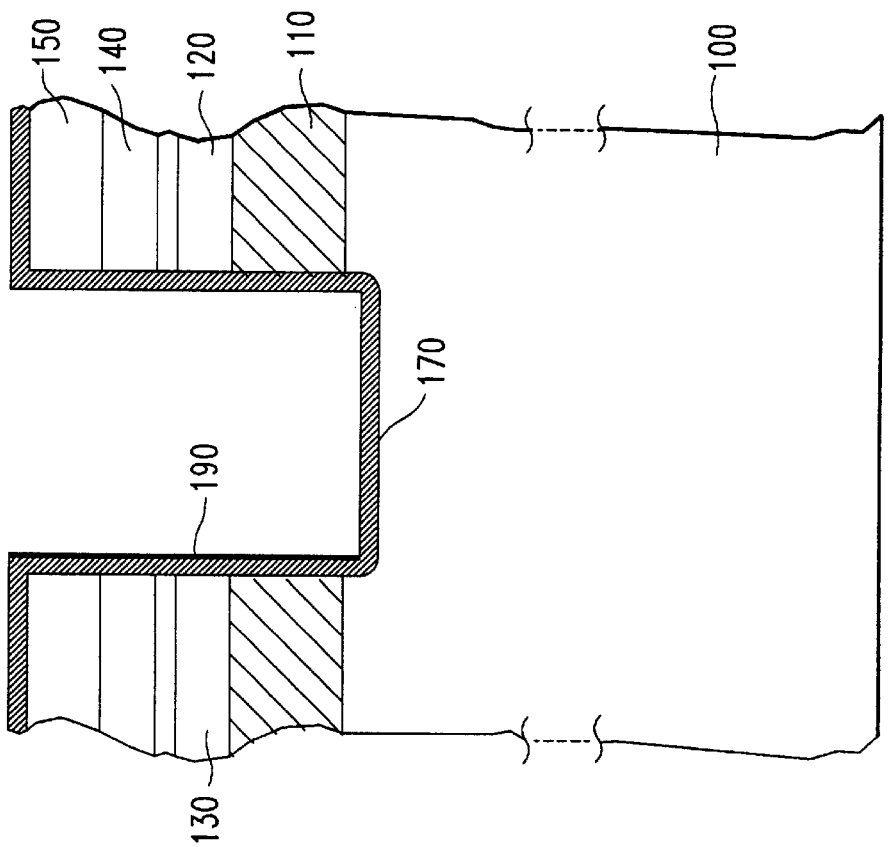
Figure 6:
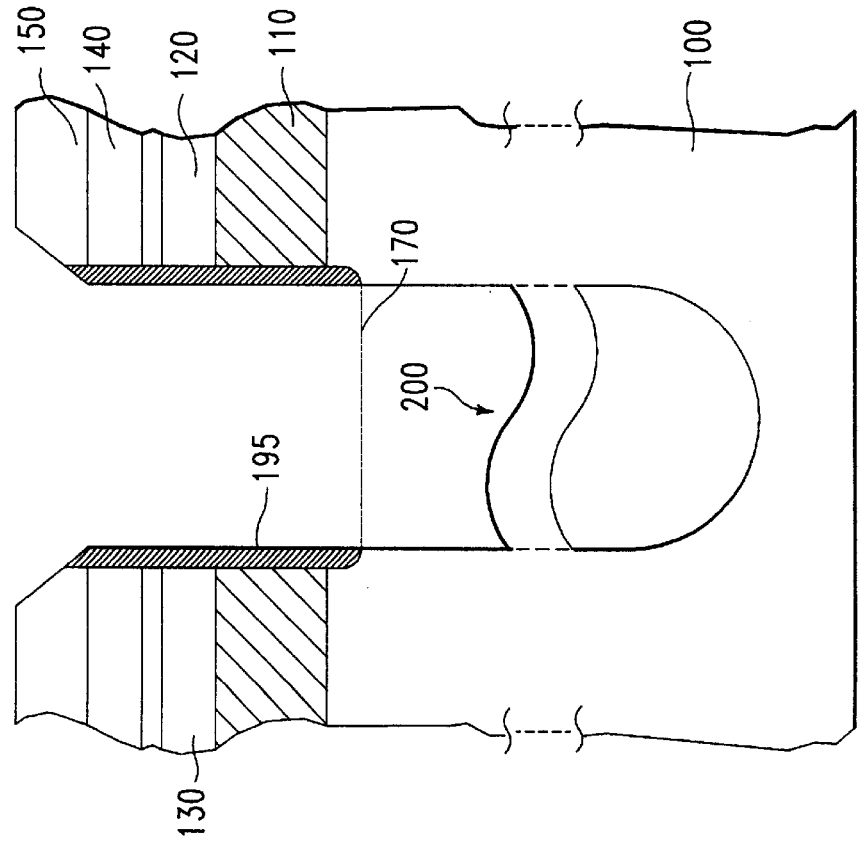

A conformal silicon nitride layer 190 is deposited as shown in FIG. 5. Layer 190 is preferably deposited by a CVD process to a thickness of at least 10 nm. As will be seen later, a minimum thickness is desirable to prevent dopant diffusion. Silicon nitride layer 190 is anisotropically etched to remove it from all horizontal surfaces including the bottom of the trench. This leaves the vertical section within the trench in the form of a silicon nitride collar 195 as shown in FIG. 6. Collar 195 extends from near the top of the original trench surface to the bottom of the first trench indicated by dotted line 170. Subsequently, the trench is extended into the silicon substrate using the mask layers 130, 140 and 150 as well as the collar 195 as the etch mask. Silicon can be etched using a plasma containing mixtures of HBr, $NF_3$ and $O_2$ or other available processes that provide high selectivity to silicon dioxide and silicon nitride. The etch is timed to provide a certain trench depth into the silicon substrate, determined by design needs usually several microns. Thus the entire trench is formed with a minimal loss of the hard mask layers 130, 140, 150 and 195. Any removal of silicon nitride collar 195 is restricted to the top portion adjacent to the masking oxide layer 150 and the integrity of the collar along the device layer 120 and buried oxide 110 is well preserved.

Figure 7:
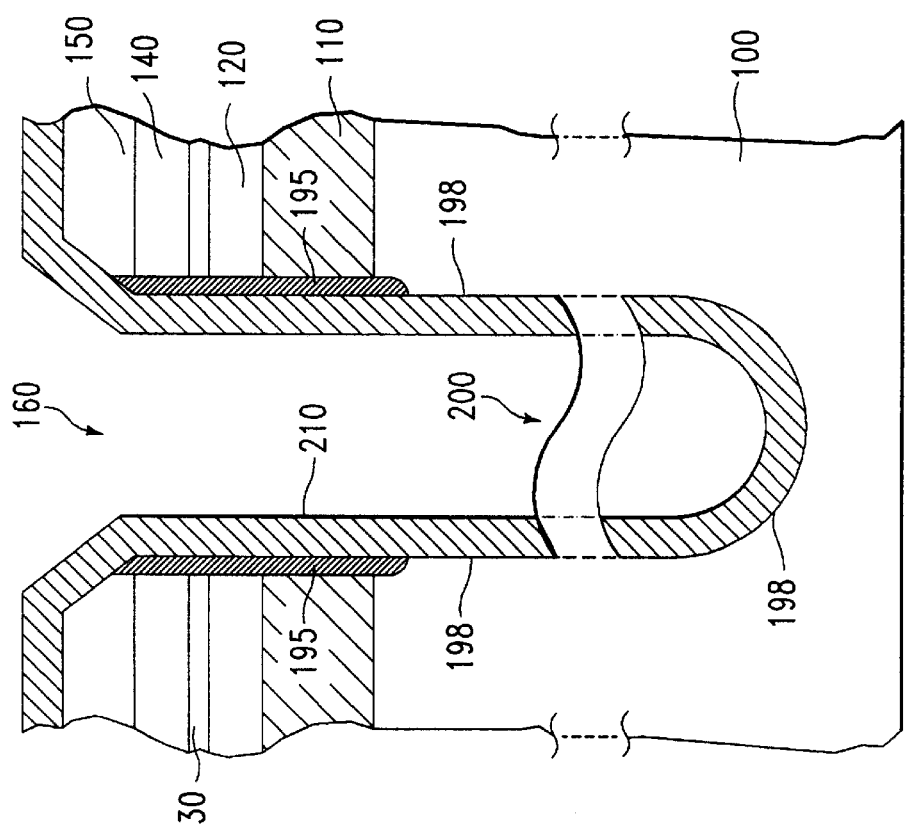

An optional trench sidewall doping is illustrated in FIG. 7. The doping can improve the conductivity of the capacitor electrode and thereby improve dram cell characteristics. Now referring to FIG. 7, a blanket film of doped silicate glass 210, such as Aresenic silicate glass (ASG) or PSG (Phosphosilicate Glass) is disposed over the entire surface. Layer 210 is typically in the range of 50 to 100 nanometer, and is preferably deposited by a CVD process. The amount of As or P present as $As_2O_3$ or $P_2O_5$ in the glass is typically chosen to be 1 to 15 weight percent and preferably in the range of 2 to 5 weight percent. In some applications, boron from $B_2O_3$ is diffused into the trench sidewall. Layer 210 is in physical contact with the top surface of the remaining layer 150 and the exterior walls of collar 195 and the inside surface 198 of the trench 200. The structure is subjected to a sufficient thermal anneal using a furnace heating or rapid thermal anneal for time-temperature sufficient to cause dopants As or P from layer 210 to diffuse into the contacting surfaces. A dotted line 220 shown in FIG. 8 indicates extent of dopant penetration into the adjacent layer. This penetration is typically of the order of 0.1 to 0.5 micron. It should be noted that dotted line 220 shows discontinuity at the location of diffusion barrier collar, i.e dopants diffuse into silicon dioxide as well as silicon but are totally stopped where the silicon nitride is present. Thus, the present structure with a nitride collar of selective depth, is self-aligned to the trench, and achieves two goals in the trench capacitor formation: 1) dope the substrate surrounding the trench to a sufficient extent to reduce its resistivity and enable it to perform as a desirable plate electrode for the trench capacitor. 2) preserve the integrity of the buried oxide, the device layer and the pad oxide by preventing any dopant penetration.

In FIG. 9, the top oxide layer 150 has already been removed preferably by wet etching using HF solution, while the nitride collar 195 preserves and protects the buried oxide from the top oxide removal process. A capacitor node dielectric layer 230 is formed along the exposed trench sidewall by thermal oxidation, nitridation or both. A thin high quality dielectric provides a high capacitance without charge leakage. For most DRAM application, typical capacitance values required range from 20 to 50 femto-farads, and preferably 30 fF. Typically, the trench depth is kept in the 3–8 micron range, the dielectric thickness is kept to an equivalent thermal oxide thickness of 5 to 10 nanometer. The top silicon nitride layer 140 and the collar silicon nitride spacer 195 restricts the formation of node dielectric layer 230 to the exposed silicon along the trench sidewalls. A doped polysilicon 240 is filled in the trench using a conformal CVD process and is etched back to leave a recessed polysilicon plug 240. The recess of the polysilicon plug 240 is controlled to be below the device layer region and above the bottom of the buried oxide layer, but still encased partly by the silicon nitride collar 195.

Figure 10:
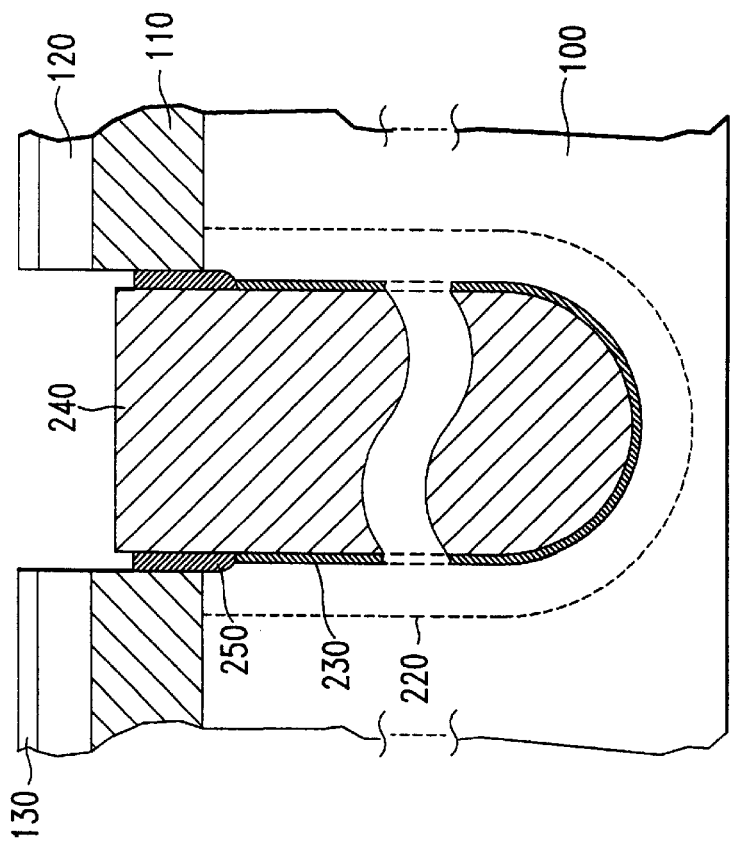

Now, referring to FIG. 10, the nitride layer 140 and part of nitride layer 195 are etched selective to oxide or polysilicon. A wet solution of hot phosphoric acid can be used. Care is taken to retain a portion of the nitride collar 250 as shown.

Figure 11:
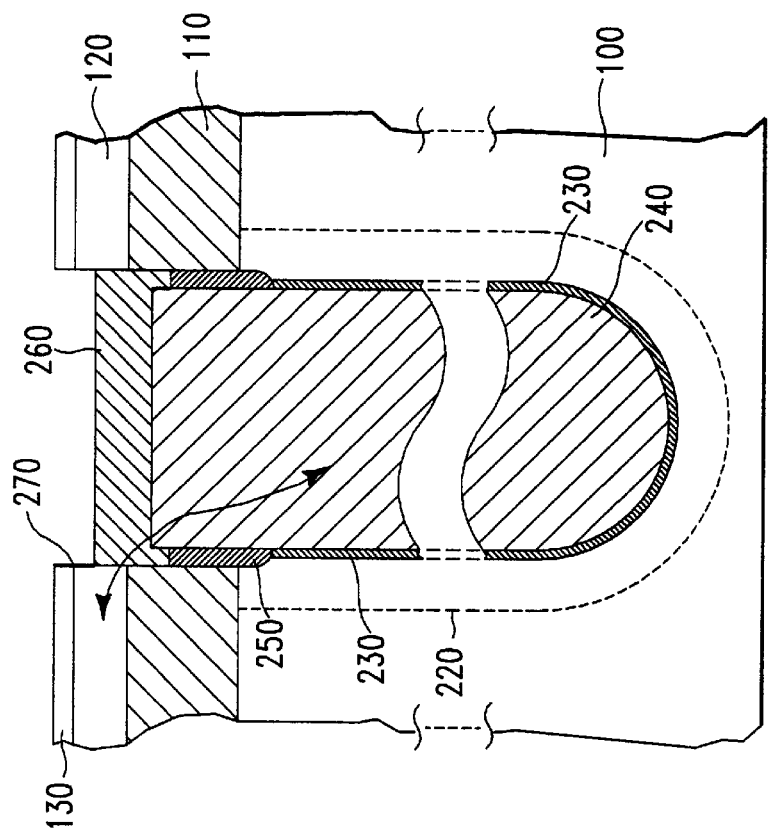
FIG. 11 illustrate a preferred process for electrical connection of the capacitor electrode to the device Si layer.
Figure 12:
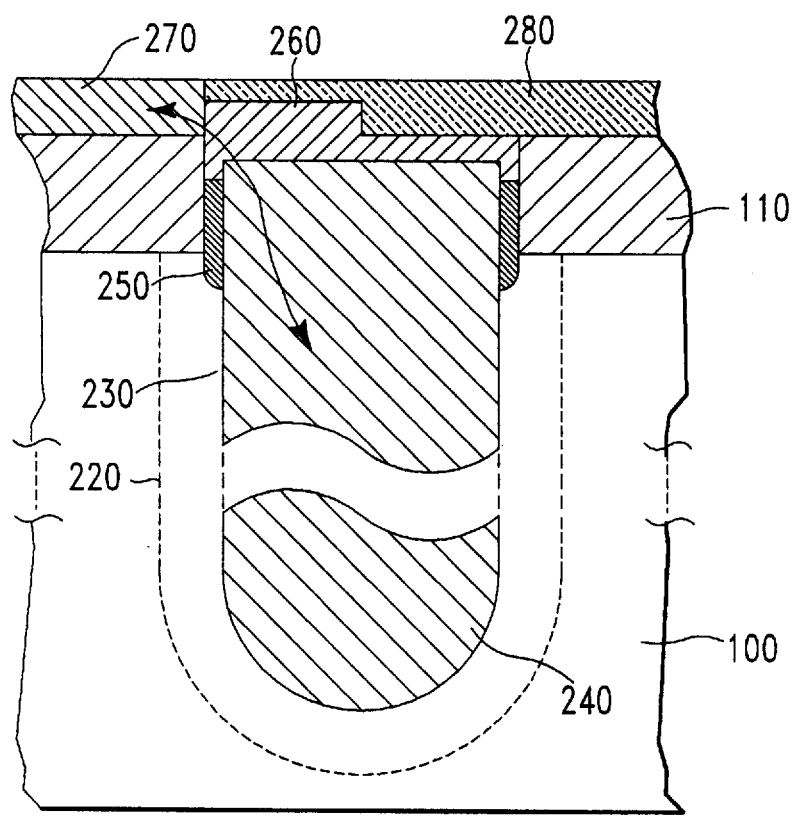
FIG. 12 illustrates the step of forming oxide isolation between adjacent devices.

At this point many alternate process schemes are feasible to complete the device. In a preferred embodiment, as shown in FIG. 11, a second polysilicon conductor 260 is selectively formed in the trench region so as to provide a connection between the capacitor body polysilicon 240 and the side of the active silicon device region 270. Other materials that are conductors can be used as layer 260. Some of the other suitable materials are tungsten, molybdenum and other metallic suicides. The details of the selective formation of 260 has not been shown, but one of the common methods involve depositing blanket layer of polysilicon over the entire substrate and etching or polishing back to remove the polysilicon outside of the trench region. FIG. 12 shows the formation of oxide isolation regions 280 to separate and isolate adjacent transistors. The connection to the other electrode of the capacitor, which is the substrate body, is now made as a substrate backside contact or as a front side contact (not shown) by etching openings on the front side to the SC body region through the device layer 120 and buried oxide layer 110 and any other intervening layers resulting from other processes. The circuit is completed by connecting the specific parts of the transistors using known thin film wiring materials and processes. These techniques are not reviewed herein as they do not directly pertain to the novelty of the present invention. The choice of specific processes and materials is driven by available multilevel interconnection technology, the needs of wiring feature dimensions and the circuit density.

While the invention has been described in terms of a single preferred embodiment, various alternatives and modifications can be devised by those skilled in the art without departing from the invention. Accordingly, the present invention is intended to embrace all such alternatives which fall within the scope of the appended claims.

What is claimed is:

1. A method of forming a trench capacitor, having a first and second electrode and a node dielectric, in an SOI substrate having a semiconductor body (SC body), a buried oxide layer overlying said SC body and a single crystalline device layer (SC device layer) overlying said buried oxide layer, comprising the steps of:

forming a masking layer over the SC device layer;
   patterning an opening in the masking layer;
   anisotropically etching a first trench corresponding to the opening in the masking layer to a first depth, through the SC device layer and the buried oxide layer, extending into the SC body;
   forming a diffusion barrier collar on the sides of the first trench to the first depth;
   forming a second trench by anisotropically etching the SC body exposed by the first trench to a second depth, sidewalls of the second trench defining the first electrode;
   forming said node dielectric layer on surface of the SC body exposed by the first and second trench; and,
   forming the second electrode by forming a doped polysilicon plug in the first and second trench.

2. The method of claim 1, further comprising the step of:
   doping the exposed sides of the first and second trench not covered by the diffusion barrier collar, prior to the step of forming the node dielectric layer.

3. The method of claim 1, wherein the step of forming the diffusion barrier collar comprising the steps of:
   conformally depositing a layer of the diffusion barrier over the substrate, including horizontal and vertical surfaces of the first trench; and,
   anisotropically etching the diffusion barrier layer to remove it from all horizontal surfaces only, thereby forming a diffusion barrier collar in contact with only the sides of the first trench.

4. The method of claim 1, wherein the step of forming the polysilicon plug comprises the steps of:
   forming a first polysilicon recessed in the trench region to a level, below the device layer but above the bottom of the buried oxide layer;
   removing the diffusion barrier collar region exposed above the first polysilicon; and,
   forming a second polysilicon recessed within the trench, in contact with the top of the first polysilicon and in contact with the exposed side of the SC device layer.

5. The method of claim 1, wherein said node dielectric layer is formed using the step of:

thermally forming a silicon dioxide layer on the exposed silicon surfaces of the first and second trench.

6. The method of claim 1, wherein said node dielectric layer is formed using the steps of:

thermally forming a silicon dioxide layer on the exposed silicon surfaces of the first and second trench; and, forming a nitrogen rich layer on the surface of said silicon dioxide layer.

7. The method of claim 1, wherein said masking layer is resist.

8. The method of claim 1, wherein said masking layer comprises at least one layer selected from a group consisting of silicon dioxide, silicon nitride and silicon oxynitride layers.

9. The method of claim 1, wherein said first trench extends into the SC body past bottom of the buried oxide layer by at least 50 nanometer.

10. The method of claim 2, wherein said doping is carried out using the steps of:

depositing conformally a dopant containing glass layer overlying the sides of the first and second trench region in contact with the side surfaces of the first and second trench; and, heating to drive-in dopants from the glass layer at least into the adjacent side surface of the second trench to a nominal depth of at least 50 nanometer.

11. The method of claim 10, wherein said dopant in the glass layer is selected from the group consisting of arsenic, phosphorus and boron.

12. The method of claim 5, wherein said node dielectric layer has a thickness selected from the range of 5 to 10 nanometer.

13. A method of forming a DRAM storage cell with a trench capacitor in an SOI substrate, comprising the steps of:

providing a semiconductor body (SC body), a buried oxide layer overlying said SC body and a single crystalline device layer (SC device layer) overlying said buried oxide layer;

forming a field effect transistor (FET) consisting of a source, a drain, and a channel in said SC device layer, a gate oxide layer on the surface of the SC device layer and a gate electrode over the channel region;

forming a trench capacitor, having a first and second electrodes and a node dielectric layer therebetween, comprising the steps of:

forming a masking layer over the SC device layer;

patterning an opening in the masking layer;

anisotropically etching a first trench corresponding to the opening in the masking layer to a first depth, through the SC device layer and the buried oxide layer, extending into the SC body;

forming a diffusion barrier collar along the sides of the first trench to the first depth;

forming a second trench by anisotropically etching the SC body exposed by the first trench to a second depth, sidewalls of the second trench defining the first electrode;

forming a node dielectric layer on surface of the SC body exposed by the first trench;

forming the second electrode by forming a doped polysilicon plug in the first and second trench, said plug further making contact to the drain region of the FET;

forming a substrate contact to the SC body; and, forming isolation regions between adjacent DRAM cells through the SC device layer.

14. The method of claim 13, wherein the steps of forming the trench capacitor, further comprises the step of:

doping the exposed sides of the first and second trench not covered by the diffusion barrier collar, prior to the step of forming the node dielectric layer.

15. The method of claim 13, wherein the step of forming the diffusion barrier collar in the trench capacitor, comprising the steps of:

conformally depositing a layer of the diffusion barrier over the substrate, including horizontal and vertical surfaces of the first trench; and, anisotropically etching the diffusion barrier layer to remove it from all horizontal surfaces only, thereby forming a diffusion barrier collar in contact with only the sides of the first trench.

16. The method of claim 13, wherein the step of forming the polysilicon plug comprises the steps of:

forming a first polysilicon recessed in the trench region to a level, below the device layer but above the bottom of the buried oxide layer;

removing the diffusion barrier collar region exposed above the first polysilicon; and, forming a second polysilicon recessed within the trench, in contact with the top of the first polysilicon and in contact with the exposed side of the SC device layer.

17. The method of claim 13, wherein said node dielectric layer is formed using the step of:

thermally forming a silicon dioxide layer on the exposed silicon surfaces of the first and second trench.

18. The method of claim 13, wherein said node dielectric layer is formed using the steps of:

thermally forming a silicon dioxide layer on the exposed silicon surfaces of the first and second trench; and, forming a nitrogen rich layer on the surface of said silicon dioxide layer.

19. The method of claim 13, wherein said masking layer comprises at least one selected from the group comprising of silicon dioxide, silicon nitride and silicon oxynitride layers.

20. The method of claim 13, wherein said first trench extends into the SC body past bottom of the buried oxide layer by at least 50 nanometer.

21. The method of claim 14, wherein said doping is carried out using the steps of:

depositing conformally a dopant containing glass layer overlying side surfaces of the first and second trench; and, heating to drive-in dopants from the glass layer at least into the adjacent side surfaces of the second trench to a nominal depth of at least 50 nanometer.

22. The method of claim 21, wherein said dopant in the glass layer is selected from the group consisting of arsenic, phosphorus and boron.

23. The method of claim 18, wherein said node dielectric layer has a thickness selected from the range of 5 to 10 nanometer.

* * * * *